United States Patent [19]
Putt et al.

[11] Patent Number: 5,661,658
[45] Date of Patent: Aug. 26, 1997

[54] ELECTRICAL SYSTEM MONITORING APPARATUS WITH PROGRAMMABLE CUSTOM DISPLAY

[75] Inventors: Sally A. Putt, Imperial; Roger W. Cox, Oakdale, both of Pa.

[73] Assignee: Eaton Corporation, Cleveland, Ohio

[21] Appl. No.: 608,089

[22] Filed: Feb. 28, 1996

[51] Int. Cl.[6] .................................... G01R 13/00
[52] U.S. Cl. ................ 364/481; 364/483; 364/492; 364/551.01; 364/146; 395/140; 395/326; 340/461; 340/525
[58] Field of Search ..................... 364/481, 483, 364/492, 551.01, 188, 146; 395/161, 100, 140; 340/461, 525

[56] References Cited

U.S. PATENT DOCUMENTS

| | | | |
|---|---|---|---|
| 4,074,242 | 2/1978 | Mayer | 340/213.1 |
| 4,119,953 | 10/1978 | Yeschick | 340/324 AD |
| 4,303,973 | 12/1981 | Williamson, Jr. et al. | 364/103 |
| 4,581,705 | 4/1986 | Gilker et al. | 364/492 |
| 4,612,617 | 9/1986 | Laplace, Jr. et al. | 364/483 |
| 4,894,796 | 1/1990 | Engel et al. | 364/900 |
| 4,957,690 | 9/1990 | Fennern | 376/216 |
| 5,353,400 | 10/1994 | Nigawara et al. | 395/161 |

*Primary Examiner*—Emanuel T. Voeltz
*Assistant Examiner*—Hien Vo
*Attorney, Agent, or Firm*—Martin J. Moran

[57] ABSTRACT

Apparatus for monitoring electrical parameters in an electrical system includes a display on which values of the various monitored electrical parameters are displayed, several at a time. The apparatus can be programmed to generate a custom display presenting selected ones of the many parameters, such as the ones most often referenced by the operator, so that it is not necessary to scroll through the large number of parameters to find those of frequent interest.

1 Claim, 6 Drawing Sheets

```
┌─────────────────────────────┐
│PGM/DISPMGR/CUST             │
│                             │
│*AVG  CURRENT                │
│ AVG  LN  VOLT               │
│*AVG  LL  VOLT               │
│*GND  CURRENT                │
│ DEFAULT                     │
│ SEL    UP   DOWN  ENTER     │
└─────────────────────────────┘
```
*FIG.3*

```
┌─────────────────────────────┐
│AVG  3PA  AMPS  =          0 │
│GROUND    AMPS  =          0 │
│AVG  LL   VOLT  =          0 │
│SYS  KWATTS     =          0 │
│SYS  KVARS      =          0 │
│SYS  KVA        =          0 │
│NET  MWH        =          0 │
│  TRND   EVNT   HARM   DEMD  │
└─────────────────────────────┘
```
*FIG.4A*

```
┌─────────────────────────────┐
│IA   %THD  =              0% │
│IB   %THD  =              0% │
│IC   %THD  =              0% │
│IN   %THD  =              0% │
│VAB  %THD  =              0% │
│VBC  %THD  =              0% │
│VCA  %THD  =              0% │
│  TRND   EVNT   HARM   DEMD  │
└─────────────────────────────┘
```
*FIG.4B*

ELECTRICAL SYSTEM MONITORING APPARATUS WITH PROGRAMMABLE CUSTOM DISPLAY

BACKGROUND OF THE INVENTION

1. Field of the Invention

This invention relates to apparatus for monitoring an electrical system, and in particular to such apparatus which presents values of various parameters of the electrical system on a display. More particularly, it relates to generating custom displays presenting operator selected groups of parameters from among the very large number of parameters which can be displayed.

2. Background Information

Monitors for electrical systems provide metering and in some cases analysis of electrical parameters of the system such as current, voltage, power, energy, VARs, power factor frequency, harmonic distortion and others. For three-phase systems the number of parameters monitored is greatly increased. For instance, all three phase-to- neutral voltages are available as well as phase-to-phase voltages.

Typical state of the art monitors/analyzers for electrical systems present the parameters values on a display. On top of the line monitors multiple parameters can be displayed simultaneously but the capacity of the display is limited and so all of the parameters are not presented at one time. Typically, in such a case, the parameters are grouped by type, such as the voltages, currents, and so forth, but even then the sequence of the display of the parameters is fixed. This often requires the operator to scroll through numerous parameters to find those of interest.

There is a need for improved apparatus for monitoring electric systems, and in particular those which present the monitored parameter values on a visual display.

There is a more particular need for such improved apparatus wherein the very large number of parameters monitored can not be displayed at one time.

There is a further need for such improved apparatus which allows the operator to quickly view values of selected parameters without having to scroll through numerous parameter values not of current interest.

SUMMARY OF THE INVENTION

These needs and others are satisfied by the invention which is directed to apparatus for monitoring an electrical system which includes means sensing multiple waveforms such as current and voltage in the electrical system. The sensed waveforms are used to generate values of a predetermined, large numbers of parameters, including both measured parameters and calculated parameters. The parameter values are presented on a display a preset number at a time where the preset number that can be displayed is much smaller than the predetermined number generated. Custom display means allow the operator to select a custom set of parameters, typically the parameters of most interest to the user, for presentation on a custom display. The number of parameters in the custom set is also smaller than the predetermined, total number of parameters for which values are provided, but can be greater than the preset number that can be displayed at one time. In such case, the parameter values selected for the custom display are displayed sequentially, the preset displayed number at a time.

BRIEF DESCRIPTION OF THE DRAWINGS

A full understanding of the invention can be gained from the following description of the preferred embodiments when read in conjunction with the accompanying drawings in which:

FIG. 3 illustrates a menu presented by the apparatus of FIGS. 1 and 2 for use in generating custom displays in accordance with the invention.

FIGS. 4A and B illustrate custom display screens generated in accordance with the invention.

DESCRIPTION OF THE PREFERRED EMBODIMENTS

The present invention is directed to devices which monitor, and in some cases analyze, parameters in electric power circuits. It will be described as applied to a metering device which is used to monitor these electrical parameters. However, it will be understood that the invention is equally applicable to other devices, such as for instance circuit breakers which perform a metering function in addition to providing protection. The invention could also be applied to other devices which perform a monitoring function in addition to other functions, such as for instance, a contactor or motor starter which generates values of a number of electrical parameters for presentation to a user.

Figure 1:
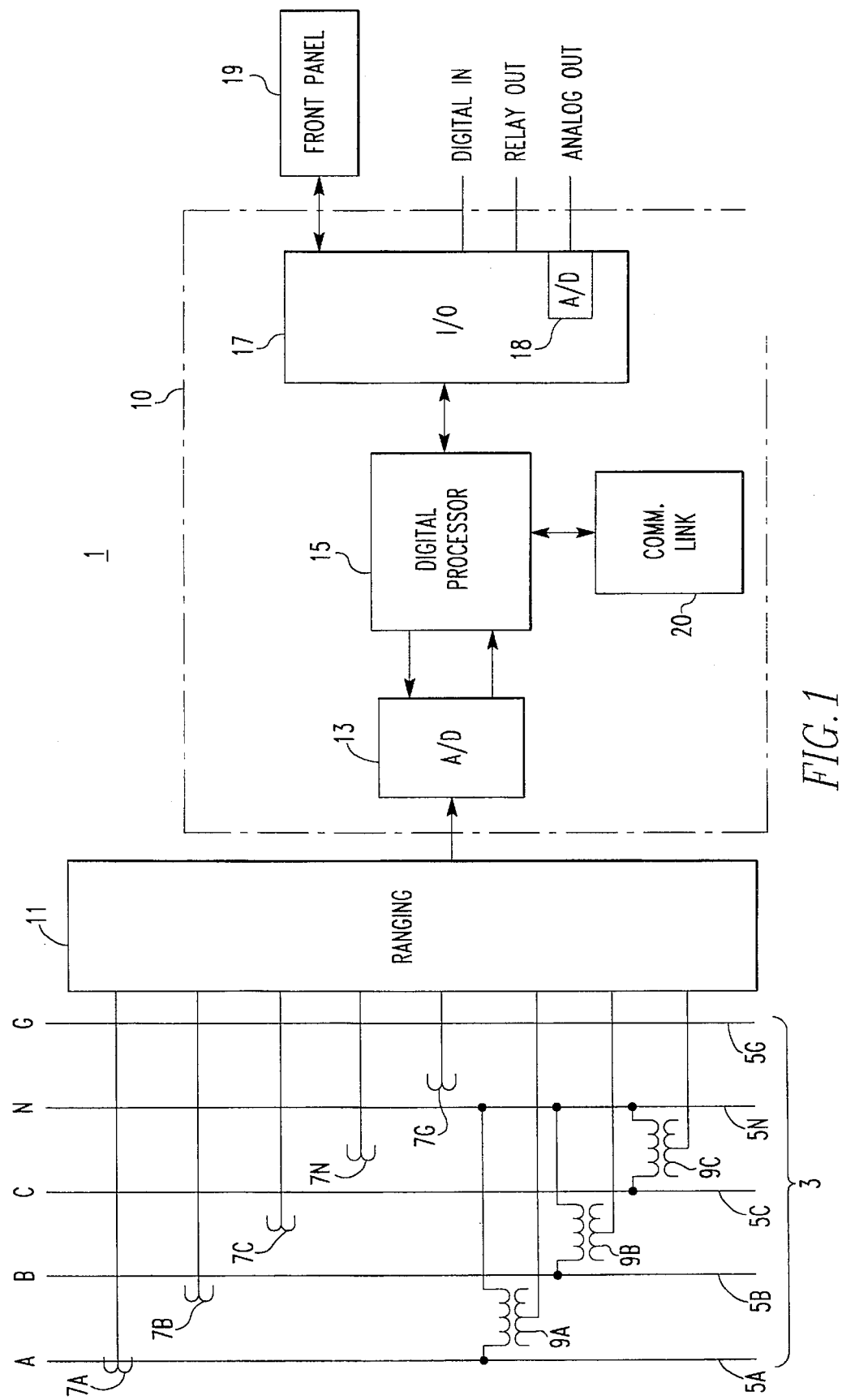
FIG. 1 is a block diagram of a monitor in accordance with the invention.

Turning to FIG. 1 the monitor or metering device 1 of the invention is used to monitor and analyze an ac electric power system 3 such as a power distribution system. The power distribution system 3 illustrated has three phase conductors 5A, 5B and 5C, a neutral conductor 5N and a ground conductor 5G. Current transformers 7A, 7B, 7C, 7N and 7G sense current flowing in each of these conductors while phase-to-neutral voltages are sensed by the potential transformers 9A, 9B and 9C, and neutral to ground voltage is sensed by transformer 9N. A microcomputer 10 includes a ranging circuit 11 which converts the current and voltage signals from −10 to 0 to +10 volt signals for conversion by an analog to digital (A/D) converter 13 for input to a digital processor 15. The A/D converter 13 samples the analog voltages and currents at sampling rates determined by interrupts generated by the digital processor 15.

The digital processor 15 utilizes the data generated by the digital samples of current and voltage to generate values of two sets of electrical parameters. The first set of parameters is related to the monitoring functions and includes metered parameters such as, for example: RMS currents and voltages, peak currents and voltages, minimum currents and voltages, power factor, watts, VARs, volt-amps, total harmonic factor, K-factor, CBMEA derating factor, and the like. The second set of parameters calculated by the digital processor 15 comprises the individual harmonic coefficients representative of relative amplitude of each harmonic.

The microcomputer 10 has an input-output (I/O) 17 through which the processor 15 is connected to a front panel 19. Preferably, the microcomputer with its ranging circuits 11, processor 15 and I/O 17 is integrated on a single chip with a communications link 20 such as shown in U.S. Pat. No. 5,270,898.

The input/output device 17 also interfaces the digital processor 15 with contact inputs through a DIGITAL IN input. A RELAY OUTPUT, and an ANALOG OUTPUT through a digital to analog (D/A) converter 18, are also provided through the input/output device 17. The digital processor 15 can also communicate with a remote processor (not shown) through a communications link 20.

Figure 2:
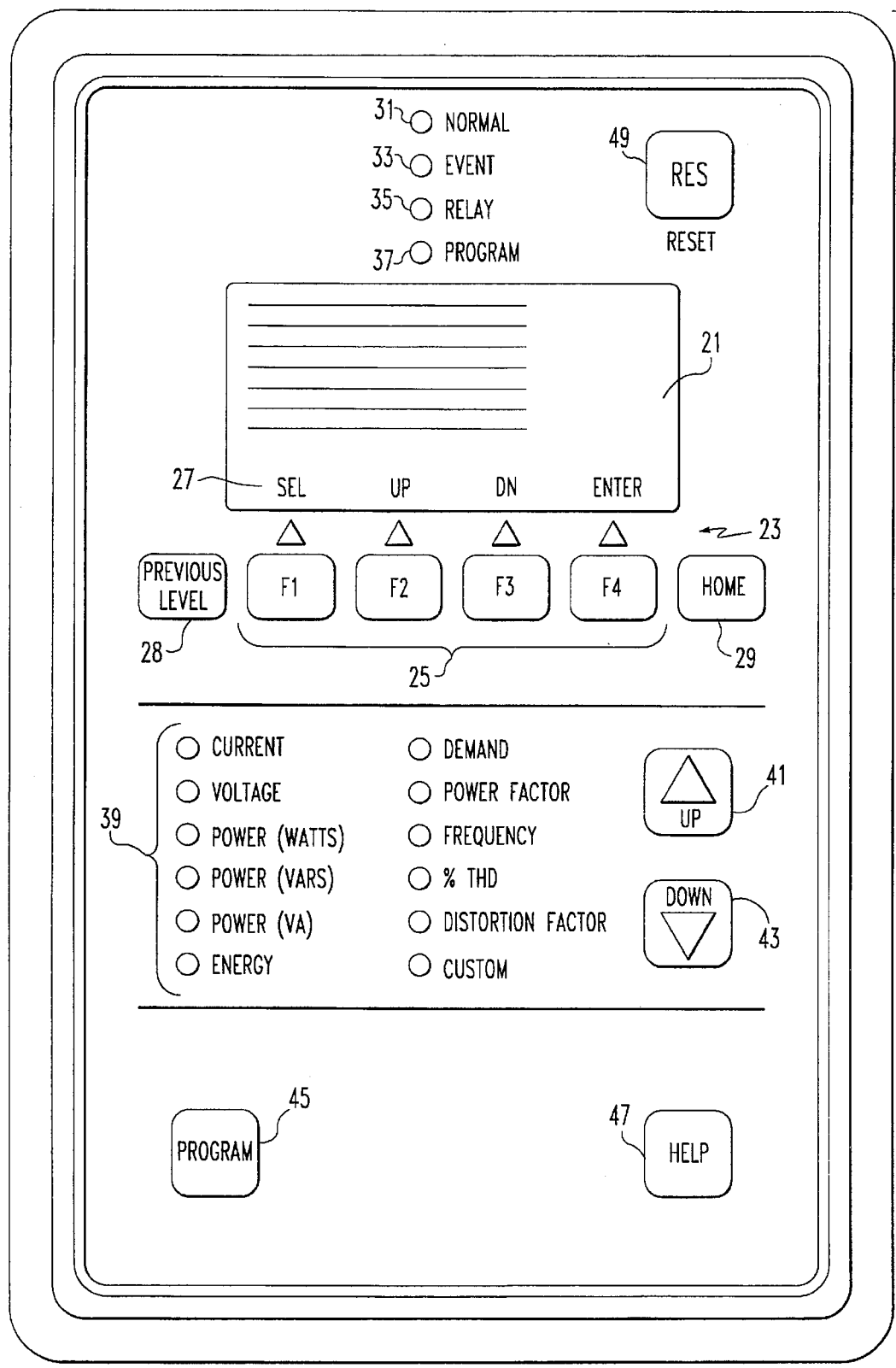
FIG. 2 is a front elevation view of a front panel which forms part of the monitor.

FIG. 2 is an illustration of the front panel 19 which forms the user interface. A major feature of the front panel 19 is a display 21, which in the exemplary embodiment of the invention is an eight line gas plasma display. Preferably, the user interface is in the form of soft keys 23 presented on the display 21. The user makes a selection by touching an appropriate one of a number of switches 25 labeled F1–F4 located on the front panel adjacent the display 21. The functions of the switches 25 are indicated by the soft switch icons 27 presented on the display and can change from screen to screen. Other types of user interface devices 23 can be used such as a keyboard, mouse or track ball. A meter menu is presented on the display 21 for use by the operator in selecting the parameters of interest from the large number of parameters generated by the device. Additional switches 28 labeled PREVIOUS LEVEL and 29 labeled HOME allow the operator easily to move through the menus.

The gas plasma display 21 can provide up to 8 lines of information with the bottom line being used for the soft key icons 27. In some modes, two lines can be used to provide larger, high visibility characters.

The front panel 19 includes a number of light emitting diodes (LEDs) to indicate a number of functions, operations and/or events. Four LEDs at the top of the front panel 19 provide a quick snapshot of the unit's status. A normal LED 31 blinks green to indicate power to the unit, normal system operation and that all parameters are within programmed thresholds. The LED 31 is not lighted if there is a malfunction. An EVENT LED 33 lights to indicate that an event has occurred, such as a parameter has exceeded the selected threshold. A RELAY LED 35 illuminates to indicate that one of the relays has changed from a normal operating state. The PROGRAM LED 37 lights to indicate that the program mode has been selected and that program screens are displayed on the display 21.

The front panel 19 includes 12 additional LEDs 39. As mentioned, the monitor 1 tracks a large number of electrical parameters, 60 in the exemplary monitor. Obviously, since the display 21 can present only seven lines of characters at a time, the values of all of these parameters cannot be presented simultaneously. However, the parameters are grouped by type, and the LEDs 39 indicate the type of parameters being presented on the display.

As mentioned above, an operator may desire to have access to parameters from different groups readily available. Thus, in accordance with the invention custom displays can be generated on the display 21. These custom displays can be programmed to provide up to 14 parameters selected by the operator. The fourteen parameters are presented on two screens containing seven parameters each. The LED 39' indicates that custom displays are being presented on the display device 21. An UP button 41 and a DOWN button 43 allow the operator to select the category of parameters to be displayed or to select the custom display. A PROGRAM button 45 allows the operator to enter the program mode and a HELP button 47 produces hypertext on the display 21 for assisting the operator in use of the monitor. A RESET push button 49 is used to access screens to direct actions for resetting a variety of program parameters.

In order to select the parameters to be shown on the custom display screens, the operator presses the program push button 45. This brings up a set of menus which includes a display manager menu from which custom screens can be selected. When custom screens is selected from the display manager menu in the program mode, a custom screen menu is presented on the display 21. One of the screens of this menu 51 is shown in FIG. 3. The menu comprises a list of the electrical parameters tracked by the monitor. As previously mentioned, this is 60 parameters in the case of the exemplary monitor. This menu also includes a DEFAULT option. The default display option automatically selects 14 parameters in the list which are generally the most commonly used parameters for most applications. The custom screen menu also includes a blank line option which allows the user to insert a blank line on the screen to separate groupings of parameters and make the screen more readable. Thus, there are 62 choices for generating the custom displays. By using the UP and DOWN soft keys, the operator can scroll through the items on the custom screen menu. A parameter is selected for inclusion in the custom screen display by pressing the SEL soft key. This inserts an asterisk to the left of the displayed parameter as shown in FIG. 3. When all of the desired parameters have been selected (up to a maximum of 14), the ENTER soft key is pressed.

Figure 5A:
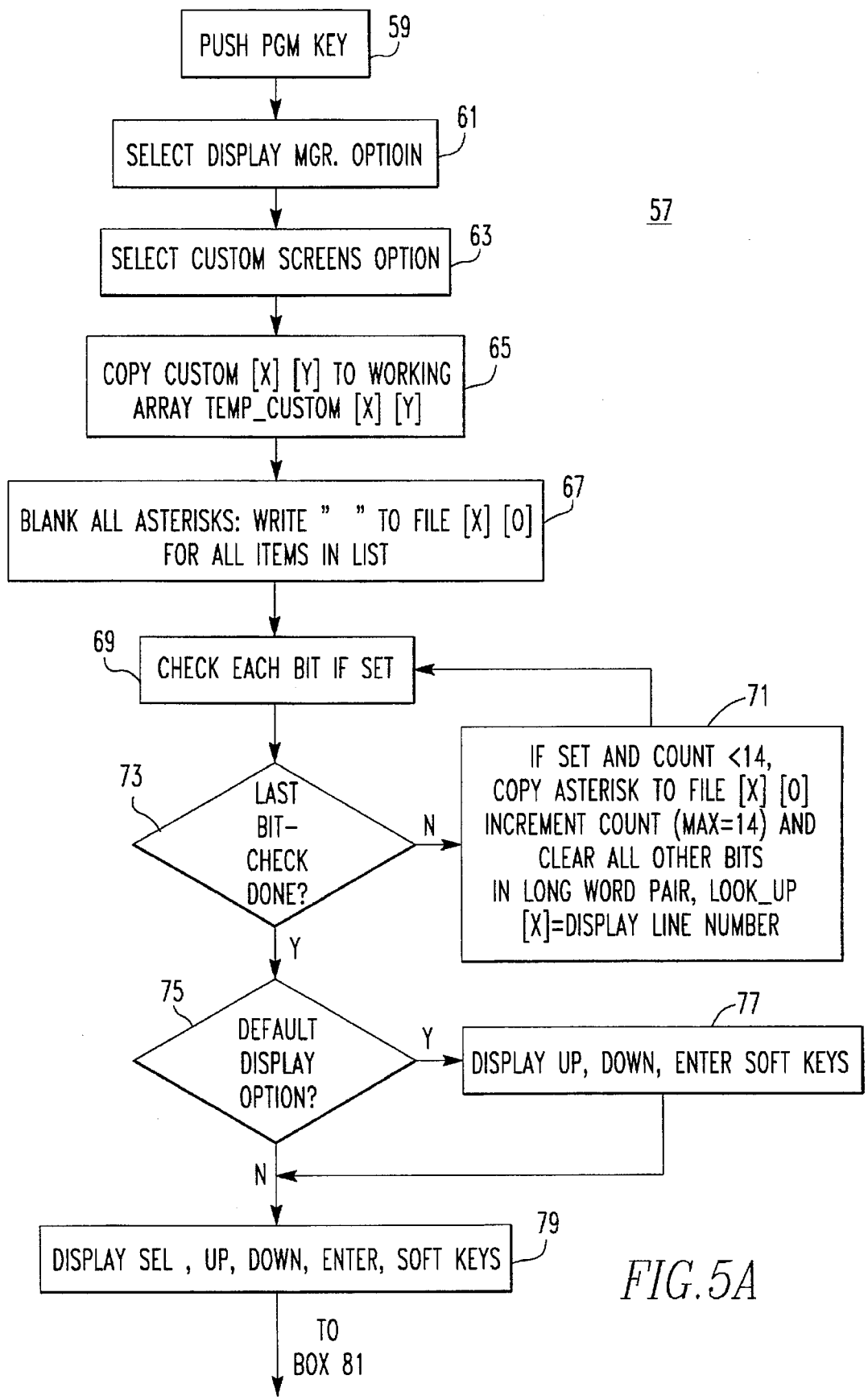
FIGS. 5A–C illustrates a flow chart for a computer program used by the monitor to generate the custom display.
Figure 5B:
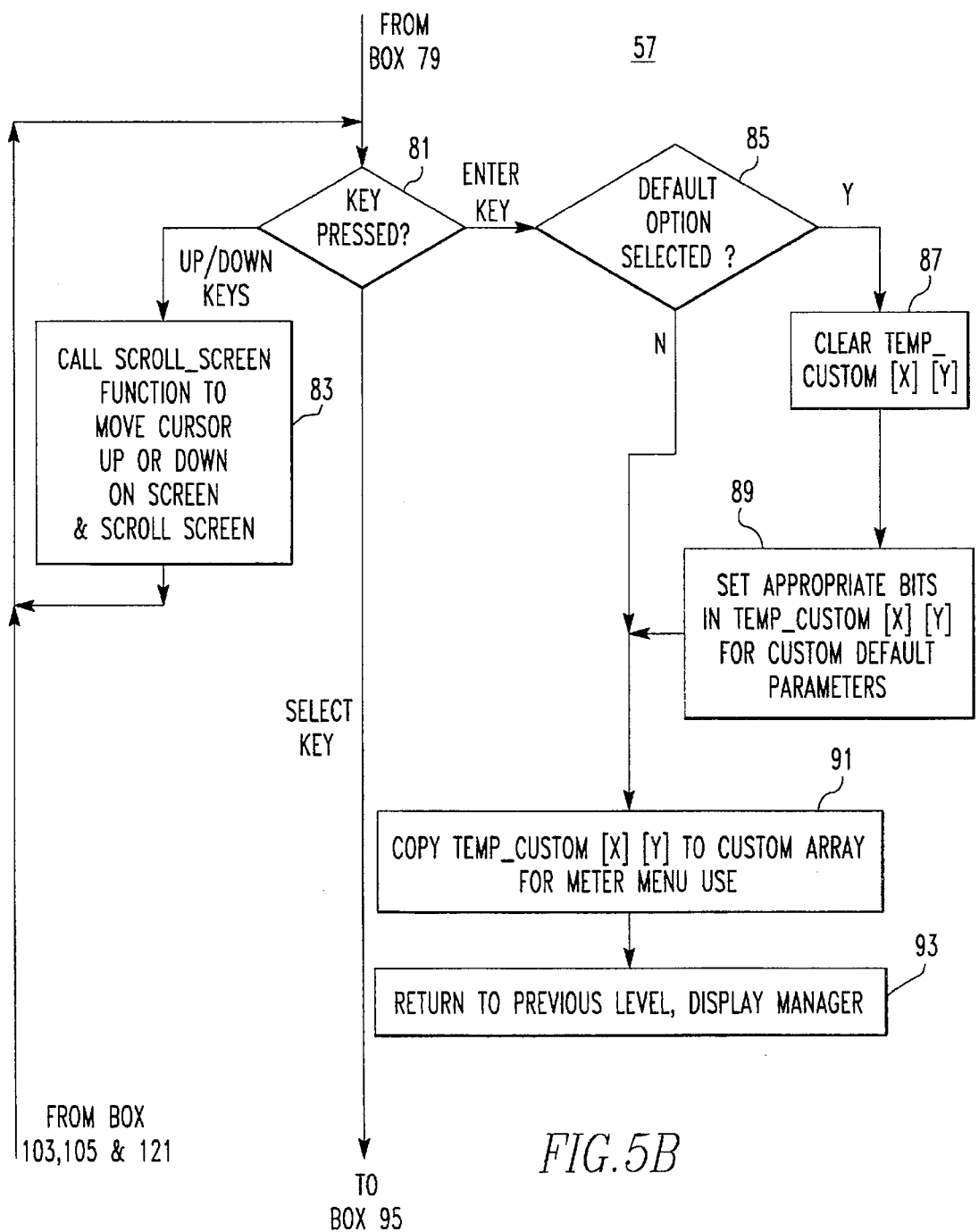
Figure 5C:
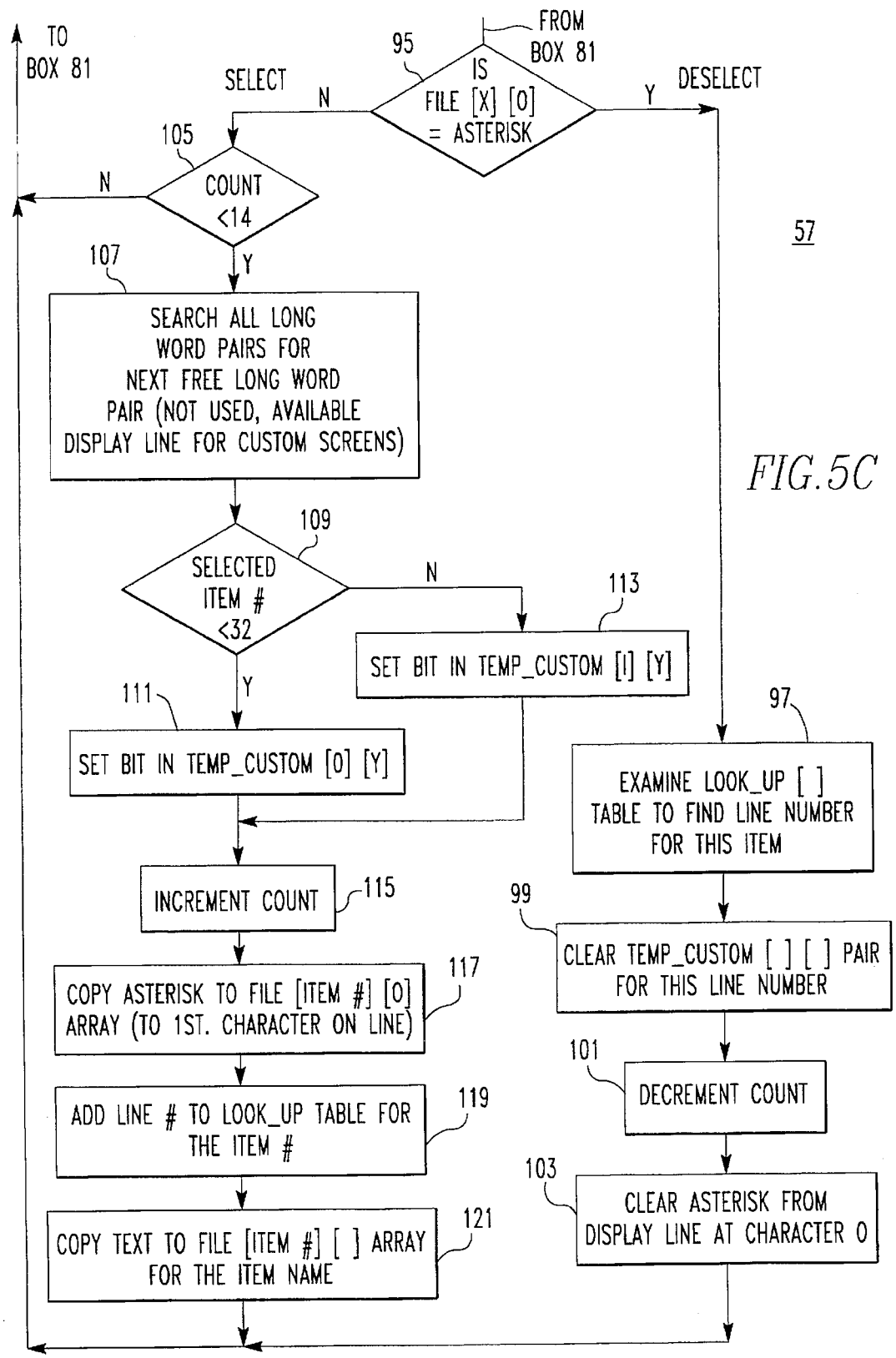

FIGS. 4A and 5B illustrate an exemplary set of custom screens 53 and 55 which display the 14 parameters chosen by the operator. At any time, the operator may call up these displays by pressing the UP or DN push buttons 41 and 43 on the operator panel 19 until the CUSTOM LED 39' lights. As can be seen, the soft keys on the custom display 53 and 55 are labeled TRND, EVNT, HARM and DEMD. These soft keys allow the operator to transfer to other modes of operation which include trending, event analysis, harmonic analysis and demand calculations.

The custom display is implemented with 14 pairs of long words, that is, one pair for each display line for the custom display. Each long word pair provides 64 bits which are mapped to represent the 62 options or choices. The bits indicate whether the parameter is selected. A two-dimensional array, CUSTOM [X][Y], of long words is used to indicate the parameter or choice that is to be included in each line of display. The X is either 0 or 1 to indicate the two words that make up the long word pair with 0 indicating the most significant word of the pair and a 1 indicating the least significant word. The first item in the list of 62 options is labeled bit 0 which is the most significant bit of the first word of the long word pair. Each item in the list is mapped to a bit sequentially in the first long word [0] and on into the next word [1] of the long word pair.

The second dimension Y of the CUSTOM [X][Y] array is the display line number (0–13). Only one bit may be set in a long word pair at a time to indicate which parameter is to be displayed on the indicated line in the custom display presented in the main meter menu. The items in the CUSTOM [X][Y] array in which a bit is set to 1 are those items in the custom screen menu 51 of FIG. 3 indicated by an asterisk. Another array called FILE [X][Y] is used to hold the text which is shown on the custom program display.

FIGS. 5A, B, and C illustrate a flow chart of the custom screen programming routine 57. The operator enters the program mode by pressing the PROGRAM push button 45 as indicated at 59. This brings up a menu from which the operator selects the display manager option at 61 and a custom screen option from a sub menu at 63. At this point, the CUSTOM [X][Y] array containing the previous selections for the custom screens is copied to a working array called TEMP_CUSTOM [X][Y] at 65. All of the asterisks are cleared from the custom screen menu at 67. Then each bit of the custom array, as set up previously, is checked at 69 to see which items has been set for each line of the display. For each bit that is set, a count is incremented at 71 and an asterisk is placed in the custom screen menu for that parameter. All other bits in the long word pair for that line of the custom display are cleared. In addition, the display line number is entered in an array called LOOK_UP [X]. When all of the bits have been checked at 73, a determination is made at 75 as to whether the default display had been selected. If so, only the UP, DOWN, and ENTER soft keys are generated on the display at 77, otherwise, the SEL soft key is also displayed at 79.

The routine then checks at 81 to see if any of the soft keys have been pressed. If either the UP or DOWN keys have been activated, a scroll-screen function is called to move the curser up or down on the screen as indicated at 83. If the ENTER key is depressed, and the default option had been selected, as determined at 85, the TEMP_CUSTOM [X][Y] array is cleared at 87 and the appropriate bits for the custom default parameters are set at 89. Then, or if the default option had not been selected, the TEMP_CUSTOM [X][Y] array is copied to CUSTOM [X][Y] array for use in the master menu to provide the custom displays, as indicated at 91. The routine then returns to the previous level of the program mode which is the display manager at 93.

If the select key is pressed at 81, selection of the highlighted parameter is toggled at 95. Thus, if an asterisk was set in the custom screen in the menu for this parameter, the item is deselected. The line number for the deselected item is determined from the LOOK_UP table at 97 and the TEMP_CUSTOM [ ][ ] pair for that line number is cleared at 99. The count is then decremented at 101 to reflect that one less item is selected, and then the asterisk is cleared for that item in the FILE [X] [0] array at 103.

If the item were being selected for the first time at 95, but the fourteen items had already been selected as determined at 105, then this item cannot be added to the list until another is removed. If less than 14 items are selected, the next available line is determined at 107. Depending upon which long word the bit for the selected item resides in, as determined at 109, the appropriate bit in the appropriate long word of the pair for that line is set at 111 or 113 and then the count is incremented at 115 to reflect that a parameter has been added to the custom screen list. An asterisk indicating selection of the item is then added to the custom screen menu at 117 and the line number for the item is added to the LOOK-UP table at 119. Finally, the text is copied to the FILE [ ][ ] array for that item at 121.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for monitoring an electrical system, comprising:

means for sensing a plurality of waveforms in said electrical system;

means for generating a predetermined number of electrical parameter values from said waveforms sensed by said sensing means;

display means for displaying up to a preset number of said predetermined number of electrical parameter values at a time, said preset number being substantially less than said predetermined number;

custom display means selecting electrical parameter values from said predetermined number of electrical parameter values for inclusion in a custom set of electrical parameter values, said custom set of electrical parameter values being smaller in number than said predetermined number of parameter values; and selection means for selecting said custom set of electrical parameter values for display on said display means said preset number at a time, wherein said custom set includes a number of electrical parameter values which is greater than said preset number of electrical parameter values, and wherein said selection means include means for sequentially displaying portions of said custom set of electrical parameter values said preset number at a time.

* * * * *